United States Patent

[11] 3,614,474

[72] Inventor Larry Alan Hahn
Richardson, Tex.
[21] Appl. No. 770,259
[22] Filed Oct. 24, 1968
[45] Patented Oct. 19, 1971
[73] Assignee Texas Instruments Incorporated
Dallas, Tex.

[54] SEMICONDUCTOR POWER-SWITCHING APPARATUS
16 Claims, 5 Drawing Figs.

[52] U.S. Cl. .......... 307/252 C,
307/252 R, 307/252 H, 307/254, 307/305
[51] Int. Cl. .......... H03k 17/00
[50] Field of Search .......... 307/252,
305, 254

[56] References Cited
UNITED STATES PATENTS

| | | | |
|---|---|---|---|
| 3,217,176 | 11/1965 | Chin | 307/252 |
| 3,268,776 | 8/1966 | Reed | 307/252 |
| 3,431,467 | 3/1969 | Calfee | 307/252 |
| 3,439,189 | 4/1969 | Petry | 307/252 |
| 3,466,467 | 9/1969 | Houcke | 307/305 |

OTHER REFERENCES

I.B.M. Tech. Disclosure, A. J. Groudis, Vol. 4, No. 9, Feb. 1962, 307/305

*Primary Examiner*—Donald D. Forrer
*Assistant Examiner*—David M. Carter
*Attorneys*—Samuel M. Mims, Jr., James O. Dixon, Andrew M. Hassell, John E. Vandigriff, Harold Levine, Melvin Sharp, Gerald B. Epstein and Koening, Senninger, Powers and Leavitt

ABSTRACT: Apparatus is disclosed for semiconductor switching of relatively high-current, high-voltage power loads. An SCR is connected serially with a transistor for switching of a power circuit. Control circuitry is provided for switching on the circuit by triggering the SCR and turning on the transistor. Turnoff of the SCR for switching off the circuit is accomplished by turning off the transistor and providing a shunt path through the gate of the SCR for momentarily shunting the load current around the transistor.

Larry Alan Hahn,
Inventor.
Koenig, Senniger,
Powers and Leavitt,
Attorneys.

SEMICONDUCTOR POWER-SWITCHING APPARATUS

The invention is in the field of apparatus for switching of relatively large amounts of power, e.g., power loads having a volt-ampere (VA) product of 500 volt-amperes or greater, and more particularly to such apparatus for switching power of this magnitude by the use of silicon control rectifiers (SCR's). An application involving relatively large power loads is in the operation of television horizontal sweep circuits.

It is often desired to employ SCR's and similar bistable four-layer semiconductor devices (e.g., thyristors) for power switching because of their low cost as compared with high-power switching transistors, SCR's are not limited, for example, by the gain and low saturation voltage requirements of such transistors. Furthermore, SCR's exhibit better voltage-blocking capability than transistors in terms of their respective costs.

However, while SCR's are conveniently triggered into a conductive state by the application of a triggering current to the gate electrode, they are difficult to turn off, i.e., to be switched to a nonconductive state, once they are turned on. This does not usually present any serious problem where an AC voltage is applied to the SCR since the voltage will be zero-valued between half-cycles thereby permitting the current to fall below the holding current, i.e., the current below which the SCR will revert to its high-impedance nonconductive state. However, in employing SCR's in DC circuits, means have heretofore been required for either mechanically or electrically breaking the current flowing through the SCR, or by reverse biasing the SCR, so as to reduce the current flowing through the anode and cathode to less than the holding current. Thus, while SCR's find frequent application in AC circuits or where such current-commutating means can be provided, as in inverter circuits, in DC power circuits generally the turnoff problem remains a serious one.

Although there have been developed bistable semiconductor switching devices which have gate turnoff capabilities, i.e., gate-controlled switches (GCS's), these are not yet fully acceptable in high-power applications because of their limited turnoff gain and the difficulty and cost of their manufacture.

Accordingly, among the several objects of the invention may be noted the provision of apparatus for semiconductor switching of relatively high-current, high-voltage electrical power loads operated on direct current; the provision of such apparatus employing a relatively inexpensive SCR and simple and economical means for turning off the SCR; and the provision of such apparatus employing a relatively low-voltage transistor for turning off the SCR. Other objects and features will be in part apparent and in part pointed out hereinafter.

Briefly, the apparatus of this invention includes a triggerable semiconductor current-switching device, or SCR, having its main terminals serially connected in a power circuit with the emitter and collector terminals of a transistor. Means is provided for applying a triggering current signal to the gate of the device. Also provided is means for applying a control current signal to the base of the transistor to initiate conduction through the serially connected device and transistor in response to an input signal. This apparatus further includes means providing a low-impedance shunt path around the collector-emitter circuit of the transistor from the gate terminal of the device whereby when the control current signal is withdrawn from the base terminal to terminate conduction between the collector and emitter terminals of the transistor, the load current is momentarily diverted through the gate of the device and bypasses one of its main terminals. The device is thereby turned off.

In the accompanying drawings, in which various possible embodiments of the invention are illustrated, FIG. 1 is a schematic circuit diagram of semiconductor switching apparatus of this invention;

Corresponding reference characters indicate corresponding parts throughout the several views of the drawings.

Figure 1:
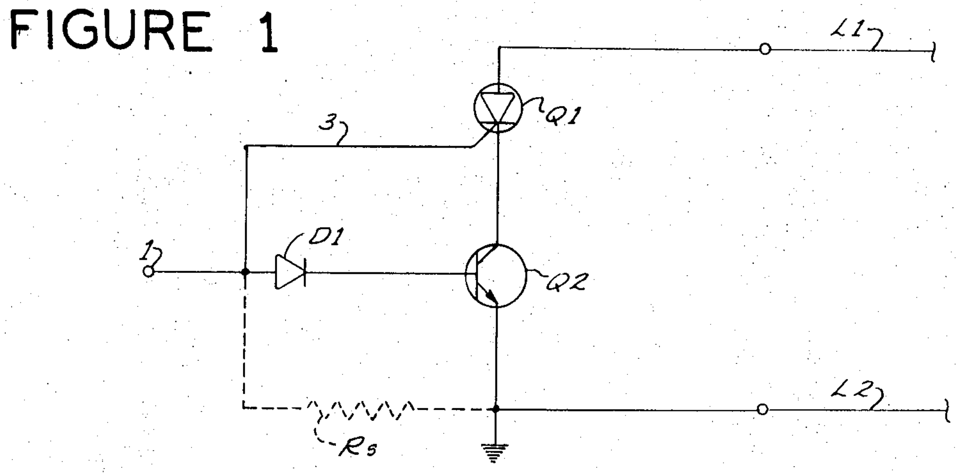

Referring now to the drawings, and particularly to FIG. 1, there is shown a semiconductor current-switching apparatus of this invention. A pair of leads L1 and L2 connects the apparatus in a power circuit which is to be switched by the apparatus. The circuit includes a power source and a load impedance and may carry relatively high-current, high-voltage power loads, i.e., having a volt-ampere product of the order of 500 volt-amperes or greater. The lead L2 is shown at ground potential for simplifying reference to the potentials applied to the various terminals of the apparatus.

An SCR is designated Q1 and has an anode terminal and a cathode terminal constituting the main terminals thereof. The SCR Q1 is of a type which has no gate-cathode shorts. It may be of a gold-doped type if very fast switching speeds (e.g., in the order of a microsecond) are required. The SCR Q1 is of the family of triggerable semiconductor current-switching devices having main and gate terminals in which conduction between the main terminals is initiated by applying a triggering current to the gate terminal and is sustainable by internal regenerative action to provide a latching mode of operation.

A transistor Q2 has its collector and emitter terminals serially connected in the power circuit with the anode and cathode terminals of the SCR. The transistor is employed essentially in a switching mode, with conduction between its collector and emitter terminals being a function of a current applied to its base terminal.

A diode D1 constitutes an impedance connected between an input terminal 1 and the base terminal of transistor Q2, and a conductor 3 connects the gate terminal of Q1 to input terminal 1. The conductor provides means for applying a triggering current signal to the gate of the SCR and the diode connection constitutes means for applying a control current signal to the base terminal of the transistor. The input signal is supplied by circuitry having a low-output impedance, e.g., a battery or transistor output circuitry, or by a high-impedance signal source across a relatively low value of resistance. This low impedance is represented by a resistance $R_s$ shown as a dashed line and connected between input terminal 1 and the emitter of transistor Q2. The gate terminal of SCR Q1, conductor 3, and the dashed resistance $R_s$ provide a low-impedance shunt current path around the collector-emitter circuit of transistor Q2 for purposes which will subsequently be described.

In the operation of the FIG. 1 circuit, the leads L1 and L2 connect the apparatus so that the power source of the circuit to be switched causes a positive voltage to appear at L1. Initially SCR Q1 and transistor Q2 are in their nonconductive states. An input signal applied to terminal 1 by connecting, for example, a low-impedance current source of positive voltage, (such as a battery) thereto causes a triggering current signal to be applied to the gate of SCR Q1 through conductor 3 and a control current signal to be applied to the base of transistor Q2 through diode D1, thereby initiating conduction of the SCR and the transistor. The power circuit is thereby switched on. The diode D1 provides an impedance causing a small voltage drop for assuring that both the SCR and the transistor are rendered conductive.

To switch off the power circuit, the input signal at the input terminal 1 is dropped to zero or negative potential, thereby withdrawing the current control signal from the base of transistor Q2. Conduction between the collector and emitter terminals of the transistor Q2 is thus terminated, providing a high impedance in the cathode circuit of SCR Q1. Momentary shunting of the load current around the collector-emitter circuit of the transistor Q2 protects the transistor from the full voltage of the load circuit. As the resistance $R_s$ comprises means providing a low-impedance shunt current path around the collector-emitter circuit of the transistor Q2 from the gate terminal of the SCR Q1, substantial current can thereby momentarily flow from the gate terminal bypassing the cathode of the SCR, turning it off and thereby switching off the power circuit.

Figure 2:
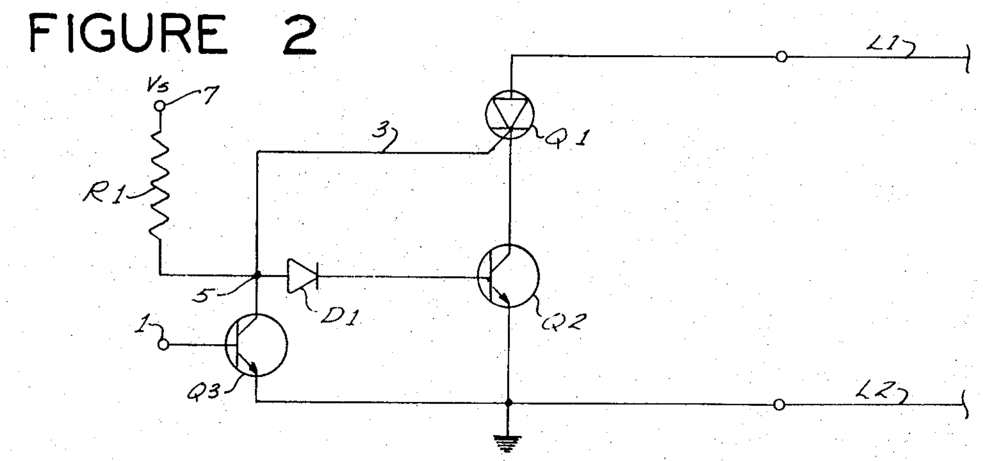
FIG. 2 is a schematic circuit diagram of another embodiment of the invention employing an additional transistor.

Referring now to FIG. 2, there is shown another embodiment of the invention. Although it functions in a manner similar to the circuit of FIG. 1, the FIG. 2 circuit includes a second transistor Q3 which has its collector and emitter terminals connected across the base and emitter terminals of transistor Q2 via diode D1. The base terminal of transistor Q3 is connected to input terminal 1 so that conduction between the collector and emitter terminals of transistor Q3 is a function of the input signal applied to terminal 1. A voltage supply circuit for transistor Q3 comprises a resistance R1 connected between a junction 5 and a terminal 7 adapted to apply a positive supply voltage V*s* to transistor Q3.

Conductor 3, together with the voltage supply circuit, constitutes means for applying a triggering current signal to the gate terminal of SCR Q1. The second transistor Q3 provides means for applying a control current signal to the base transistor Q2 and also provides a low-impedance path for momentary shunting of current around the collector-emitter circuit of transistor Q2, in the following manner: when the FIG. 2 circuit is initially connected in a load circuit and a supply voltage V*s* is applied to terminal 7, SCR Q1 is triggered and conduction through transistor Q2 is initiated. Transistor Q3, having no signal applied to its base, is nonconductive, hence represents a high impedance. To switch off the circuit, a signal (e.g., a positive voltage) is applied to the input terminal 1, causing transistor Q3 to become conductive.

The low impedance then represented by conductive transistor Q3, deprives the base of transistor Q2 of its control current signal, to cause transistor Q2 to become nonconductive. At the same time, the low impedance of transistor Q3 provides a low-impedance shunt current path around the collector-emitter circuit of transistor Q2 to provide for momentary flow of current from the gate of SCR Q1, thereby turning it off. IF the signal is removed from terminal 1, transistor Q3 once more becomes nonconductive, and the supply voltage V*s* again triggers SCR Q1 and causes transistor Q2 to become conductive.

Figure 3:
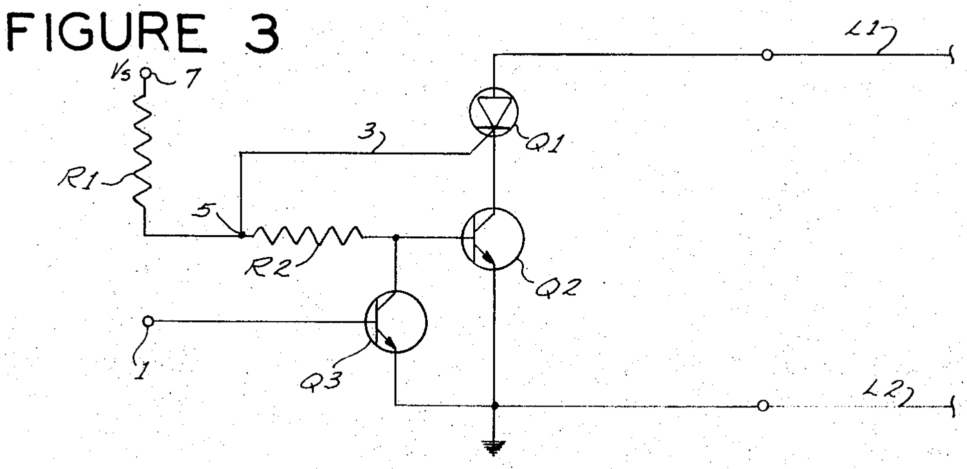
FIG. 3 is a schematic circuit diagram of a circuit which is a modification of the FIG. 2 circuit.

In FIG. 3 is shown a modification of the circuit of FIG. 2 wherein the collector and emitter terminals of transistor Q3 are directly connected across the base and emitter terminals of transistor Q2 and a resistance R2 takes the place of the impedance provided by the diode D1 of FIG. 2, so that the two resistances R1 and R2 are commonly connected at junction 5 to the gate of SCR Q1 via conductor 3, the resistance R1 being connected between the junction and terminal 7 and the resistance R2 being connected between junction 5 and the base of transistor Q2. The circuit operates in the same manner as the circuit of FIG. 2, with transistor Q3 again providing a low-impedance shunt current path around the collector-emitter circuit of transistor Q2 to permit the SCR to be turned off in the manner previously explained and thereby switching off the power circuit.

Figure 4:
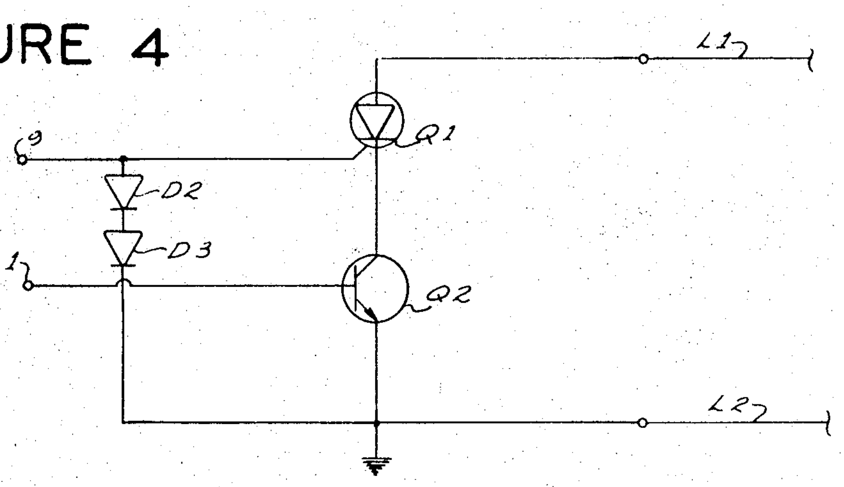
FIG. 4 is a schematic circuit diagram of another embodiment of this invention.

A further embodiment of the invention is shown in FIG. 4. The FIG. 4 circuit has a diode pair D2 and D3 for providing the low-impedance shunt path from the gate of the SCR Q1 to the emitter of Q2. In addition, a second terminal 9 provides a circuit connection to the gate of the SCR for applying the triggering current signal to its gate independently of the control current signal applied to input terminal 1, which is directly connected to the base of transistor Q2 to provide circuit means for applying the control current signal thereto. The diodes provide an impedance for establishing a voltage reference to assure turn-on of the SCR when a triggering current signal is applied at terminal 9. In addition, the diodes comprise means providing a low-impedance path for shunting of the transistor's collector-emitter circuit in the manner previously explained, when transistor Q2 becomes nonconductive, thereby causing turnoff of SCR Q1.

Figure 5:
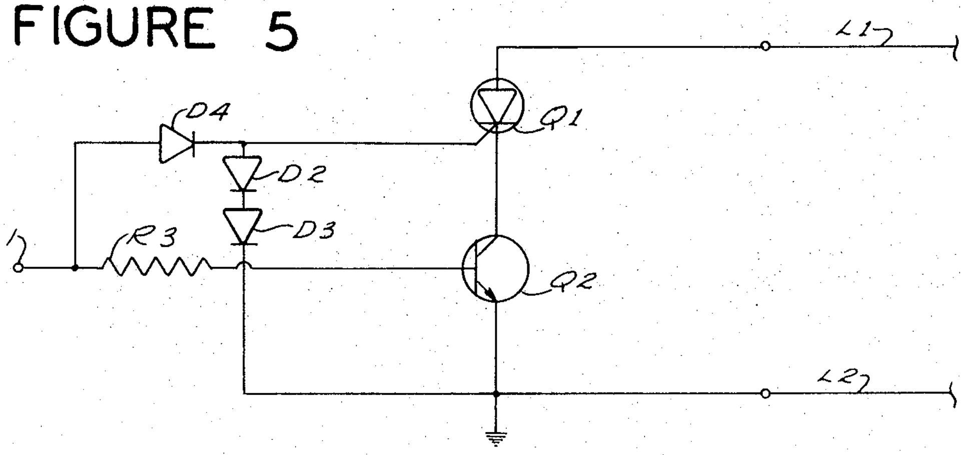
FIG. 5 is a schematic circuit diagram of a circuit which is a modification of the FIG. 4 circuit.

In FIG. 5 is shown a circuit incorporating features of the FIG. 4 and FIG. 1 circuits. This circuit includes a serially connected diode pair connected for shunting around the collector-emitter circuit of transistor Q2. However, the gate of SCR Q1 is connected through a third diode D4 to input terminal 1 and a resistance R3 is connected between the base of transistor Q2 and input terminal 1. The power circuit is turned on by applying a positive voltage to terminal 1 so that triggering control signal is applied to the gate of SCR Q1 through diode D4. The power circuit is switched off by dropping the signal at terminal 1 to a zero or negative potential, the SCR then being switched off by the momentary shunting through the diode pair D2 and D3, in the same manner as in the circuit of FIG. 4.

It is to be understood that while a diode pair is shown in FIGS. 4 and 5 as preferably comprising the low-impedance shunt current path, a single diode may be provided for this purpose under certain circumstances.

It is therefore seen that the present invention provides for a novel way of turning off an SCR in a load circuit by turning off the serially connected transistor and, at the same time, providing a low-impedance shunt path for the SCR gate around the collector-emitter circuit of the transistor. It should be understood that the applied SCR gate voltage may therefore remain at a constant positive potential and yet permit the SCR to be turned off, the transistor, as long as it is in its nonconductive state, preventing the SCR from again being turned on. As an example, a battery may be connnected between the gate of the SCR and the emitter of the transistor, thereby permitting triggering of the SCR when the transistor becomes conductive, and permitting turnoff of the SCR by means of momentary shunting of load current as the transistor is made nonconductive, through the relatively low internal impedance of the battery. It is therefore further apparent from FIGS. 4 and 5 that it is not necessary for the SCR to be "latched" on, i.e,, to pass current through its main (cathode and anode) terminals with no gate current, to be operative in the circuits of the present invention, since the voltage applied to the gate of the SCR may remain constant.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. Apparatus for semiconductor switching of relatively high-current, high-voltage electrical power leads comprising:
   - a triggerable semiconductor current-swtiching device having first and second main terminals and a gate terminal, conduction between the main terminals being initiated by applying a triggering current to the gate terminal and being sustainable by internal regenerative action to provide a latching mode of operation;
   - a transistor having collector, emitter, and base terminals, the collector and emitter terminals being serially connected in a power circuit with the main terminals of the current-switching device, conduction between the collector and emitter terminals being a function of a current applied to the base terminal;
   - means for applying a triggering current signal to said gate terminal;
   - means, including an input terminal, for applying a control current signal to said base terminal thereby to initiate conduction through the serially connected device and transistor;
   - and means providing a low-impedance shunt current path around the collector-emitter circuit of the transistor from the gate terminal of the current-switching device whereby when the control current signal is withdrawn from the base terminal to terminate conduction between the collector and emitter terminals, substantial current can momentarily flow from the gate terminal bypassing one of the main terminals thereby turning off the current-switching device.

2. Apparatus as set forth in claim 1 wherein said device is a silicon-controlled rectifier.

3. Apparatus as set forth in claim 1 wherein said low-impedance shunt path comprises a low-impedance input signal source.

4. Apparatus as set forth in claim 1 wherein said low-impedance shunt path comprises a diode.

5. Apparatus as set forth in claim 1 further comprising a second transistor wherein said low-impedance shunt path comprises the collector-emitter circuit of the second transistor.

6. Apparatus as set forth in claim 1 wherein said means for applying a triggering current signal to the gate terminal includes said input terminal.

7. Apparatus as set forth in claim 1 wherein said means for applying a triggering current signal includes a voltage supply circuit.

8. Apparatus as set forth in claim 1 which further includes a second input terminal adapted to be connected to a separate triggering signal source.

9. Apparatus as set forth in claim 1 wherein an impedance is interconnected between said gate and base terminals.

10. Apparatus as set forth in claim 9 wherein said impedance is a resistance.

11. Apparatus as set forth in claim 9 wherein said impedance includes a diode.

12. Apparatus as set forth in claim 1 wherein said means for applying controlled current signal to said base terminal includes a second transistor having collector, emitter and base terminals, the collector-emitter circuit of said second transistor being included in the low-impedance shunt current path, the base terminal of said second transistor comprising said input terminal, conduction between the collector and emitter terminals of the second transistor thereby being a function of the input signal.

13. Apparatus as set forth in claim 12 wherein said means for applying a triggering current signal to said gate terminal comprises a voltage supply circuit for supplying the second transistor with operating voltage.

14. Apparatus as set forth in claim 1 wherein said means providing a low-impedance shunt current path includes a diode connected between the gate terminal of said current-switching device and the emitter terminal of said transistor.

15. Apparatus as set forth in claim 14 wherein said means for applying a triggering control signal to said gate terminal comprises a diode connected between the gate terminal and the input terminal and said means for applying a control current signal to said base terminal comprises a resistance connected between the base terminal and the input terminal.

16. Apparatus for semiconductor switching of relatively high-current, high-voltage electric power loads comprising:

a triggerable semiconductor current-switching device having first and second main terminals and a gate terminal, conduction between the main terminals being initiated by applying a triggering current to the base terminal and being sustainable by internal regenerative action to provide a latching mode of operation;

a transistor having collector, emitter and base terminals, the collector and emitter terminals being serially connected in a power circuit with the main terminals of the current-switching device, conduction between the collector and emitter terminals being a function of a current applied to the base terminal;

circuit means, including an input terminal, connected to said gate terminal for applying a triggering current signal thereto;

second circuit means, including a second input terminal, connected to said base terminal for applying a control current signal thereto; and diode means, connected between said gate terminal and the emitter terminal of said transistor, for providing a low-impedance shunt current path around the collector-emitter circuit of the transistor from said gate terminal whereby when the control current signal is withdrawn from the base terminal to terminate conduction between the collector and emitter terminals, substantial current can momentarily flow from said gate terminal bypassing one of the main terminals thereby turning off the current-switching device.